US012776348B2

(12) United States Patent
Murata

(10) Patent No.: US 12,776,348 B2
(45) Date of Patent: Oct. 27, 2026

(54) SEMICONDUCTOR MEMORY DEVICE HAVING STAIRCASE CONDUCTIVE REGION

(71) Applicant: Kioxia Corporation, Tokyo (JP)

(72) Inventor: Takeshi Murata, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 342 days.

(21) Appl. No.: 18/459,338

(22) Filed: Aug. 31, 2023

(65) Prior Publication Data

US 2024/0203460 A1 Jun. 20, 2024

(30) Foreign Application Priority Data

Dec. 19, 2022 (JP) ................................. 2022-202388

(51) Int. Cl.

| | |
|---|---|
| ***G11C 5/06*** | (2006.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10B 80/00*** | (2026.01) |

(Continued)

(52) U.S. Cl.

CPC ............. *G11C 5/063* (2013.01); *H10B 43/10* (2023.02); *H10B 43/27* (2023.02); *H10B 43/35* (2023.02); *H10B 43/40* (2023.02); *H10B 80/00* (2023.02); *H10W 90/00* (2026.01); *H10W 90/26* (2026.01)

(58) Field of Classification Search

CPC ........ H10B 43/10; H10B 43/27; H10B 43/35; H10B 43/40; H10B 43/50; H10B 41/35; H10B 41/41; H10B 41/23; H10B 41/27; H10B 43/23; H10B 41/40; H10B 80/00; H01L 25/0657; H01L 2225/06565; H01L 25/16; H01L 25/18; H10W 90/00; H10W 90/26

See application file for complete search history.

(56) References Cited

U.S. PATENT DOCUMENTS

| | | | |
|---|---|---|---|
| 10,910,395 | B2 | 2/2021 | Lee |
| 11,139,237 | B2 | 10/2021 | Shao |
| 11,302,634 | B2 | 4/2022 | Xu |

(Continued)

FOREIGN PATENT DOCUMENTS

| | | | |
|---|---|---|---|
| JP | 2021048371 | A | 3/2021 |

*Primary Examiner* — Julio J Maldonado
*Assistant Examiner* — Alexander Michael Miller
(74) *Attorney, Agent, or Firm* — Kim & Stewart LLP

(57) ABSTRACT

According to one embodiment, a semiconductor memory device has a first region with first conductive layers stacked in a first direction and first columnar portions, a second region with second conductive layers stacked in the first direction and second columnar portions extending in the first direction through the second conductive layers, and a third region between the first and second regions in a second direction and including third conductive layers between the first conductive layers and the second conductive layers in the second direction. A plurality of switches are arranged along the second direction to be below the first, second, and third regions. First contacts are provided to electrically connect the third conductive layers to the switches. The third conductive layers are in a staircase shape that gets nearest to the switches in a middle portion and recedes toward end portions.

21 Claims, 12 Drawing Sheets

(51) Int. Cl.
*H10W 90/00* (2026.01)
*H10W 90/26* (2026.01)

(56) References Cited

U.S. PATENT DOCUMENTS

| | | | | |
|---|---|---|---|---|
| 2017/0294383 | A1 | 10/2017 | Tanzawa | |
| 2019/0139977 | A1 | 5/2019 | Lee | |
| 2021/0091100 | A1 | 3/2021 | Takekida | |
| 2021/0257298 | A1* | 8/2021 | Xu | H10B 41/50 |
| 2022/0231038 | A1* | 7/2022 | Baek | H10B 41/27 |

* cited by examiner

SEMICONDUCTOR MEMORY DEVICE HAVING STAIRCASE CONDUCTIVE REGION

CROSS-REFERENCE TO RELATED APPLICATION

This application is based upon and claims the benefit of priority from Japanese Patent Application No. 2022-202388, filed Dec. 19, 2022, the entire contents of which are incorporated herein by reference.

FIELD

Embodiments described herein relate generally to a semiconductor memory device.

BACKGROUND

A semiconductor memory device such as a NAND flash memory may have a three-dimensional memory cell array in which a plurality of memory cells are three-dimensionally arranged. In such a memory cell array, improved voltage control of the word lines is required.

DETAILED DESCRIPTION

In general, according to one embodiment, a semiconductor memory device has a first region which includes a plurality of first conductive layers stacked in a first direction and insulated from each other, first columnar portions extending in the first direction through the plurality of first conductive layers, and memory cells at intersections of the first conductive layers and the first columnar portions. The semiconductor memory device also has second region which includes a plurality of second conductive layers stacked in a first direction and insulated from each other, second columnar portions extending in the first direction through the plurality of second conductive layers, and memory cells at intersections of the second conductive layers and the second columnar portions. A third region is provided between the first and second regions in a second direction perpendicular to the first direction. The third region includes a plurality of third conductive layers stacked in the first direction and insulated from each other, the third conductive layers are between the first conductive layers and the second conductive layers in the second direction. A plurality of switches are arranged along the second direction. The plurality of switches are below the first, second, and third regions in the first direction. A plurality of first contacts electrically connect the plurality of third conductive layers to the plurality of switches. The plurality of third conductive layers are configured in a staircase shape to be closest, in the first direction, to the plurality of switches in a middle portion of the third region, and farthest from, in the first direction, the plurality of switches at an end portion closer to the first or second region.

Hereinafter, certain example embodiments according to the present disclosure will be described with reference to the drawings. The present disclosure is not limited to these specific examples. In general, the drawings are schematic or conceptual such that depicted dimensions are not necessarily those of an actual device. In the specification and drawings, the same elements are denoted by the same reference symbols.

First Embodiment

Figure 1:
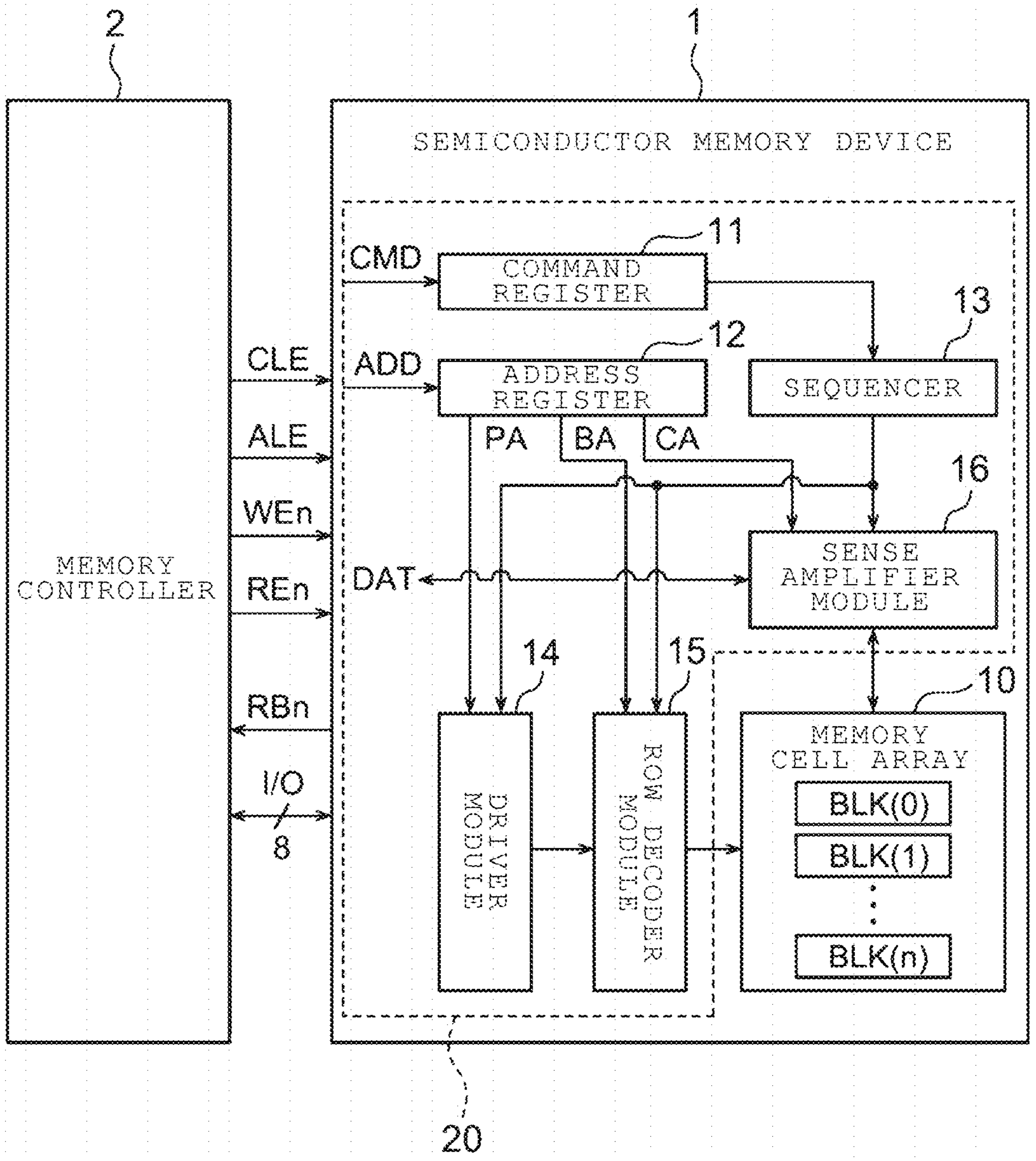
FIG. 1 is a diagram of a semiconductor memory device according to a first embodiment.

FIG. 1 is a diagram illustrating a configuration example of a semiconductor memory device 1 according to the first embodiment. The semiconductor memory device 1 is a NAND flash memory capable of storing data in a non-volatile manner. The semiconductor memory device 1 is controlled by an external memory controller 2. Communication between the semiconductor memory device 1 and the memory controller 2 occurs, for example, according to the NAND interface standard.

As illustrated in FIG. 1, the semiconductor memory device 1 includes a memory cell array 10, a command register 11, an address register 12, a sequencer 13, a driver module 14, a row decoder module 15, and a sense amplifier module 16.

The memory cell array 10 includes a plurality of blocks BLK (BLK(0) to BLK(n), where n is an integer greater than or equal to 1). Each block BLK is a set of a plurality of memory cells capable of storing data in a non-volatile manner. Data can be erased in units of a block, for example. The memory cell array 10 is provided with a plurality of bit lines and a plurality of word lines. Each memory cell is associated with one bit line and one word line.

The command register 11 stores a command CMD that the semiconductor memory device 1 receives from the memory controller 2. The command CMD includes, for example, instructions for causing the sequencer 13 to execute a read operation, a write operation, an erasing operation, and the like.

The address register 12 stores address information ADD that the semiconductor memory device 1 receives from the memory controller 2. The address information ADD includes, for example, a block address BA, a page address PA, and a column address CA. For example, the block address BA, the page address PA, and the column address CA are used to select the block BLK, the word line, and the bit line, respectively.

The sequencer 13 controls the operations of the semiconductor memory device 1 overall. For example, the sequencer 13 controls the driver module 14, the row decoder module 15, the sense amplifier module 16, and the like based on the command CMD stored in the command register 11 so as to execute the read operation, the write operation, the erasing operation, or the like corresponding to the command CMD.

The driver module 14 generates a voltage used in the read operation, the write operation, the erasing operation, and the like. The driver module 14 applies the generated voltage to a signal line corresponding to a selected word line selected based on the page address PA stored in the address register 12.

The row decoder module 15 includes a plurality of row decoders RD. The row decoder module 15 selects one block BLK in the corresponding memory cell array 10 based on the block address BA stored in the address register 12. Then, the row decoder RD transfers, for example, the voltage applied to the signal line corresponding to the selected word line to a selected word line in the selected block BLK.

In the write operation, the sense amplifier module 16 applies an appropriate voltage to each bit line according to write data DAT received from the memory controller 2. In the read operation, the sense amplifier module 16 determines data stored in the memory cell based on the voltage of the bit line, and transfers the determination result to the memory controller 2 as read data DAT.

The semiconductor memory device 1 and the memory controller 2 described above may be integrated into one semiconductor device by combining the semiconductor memory device 1 and the memory controller 2. Examples of such a semiconductor device may include a memory card such as an SD™ card, a solid-state drive (SSD), or the like.

Figure 2:
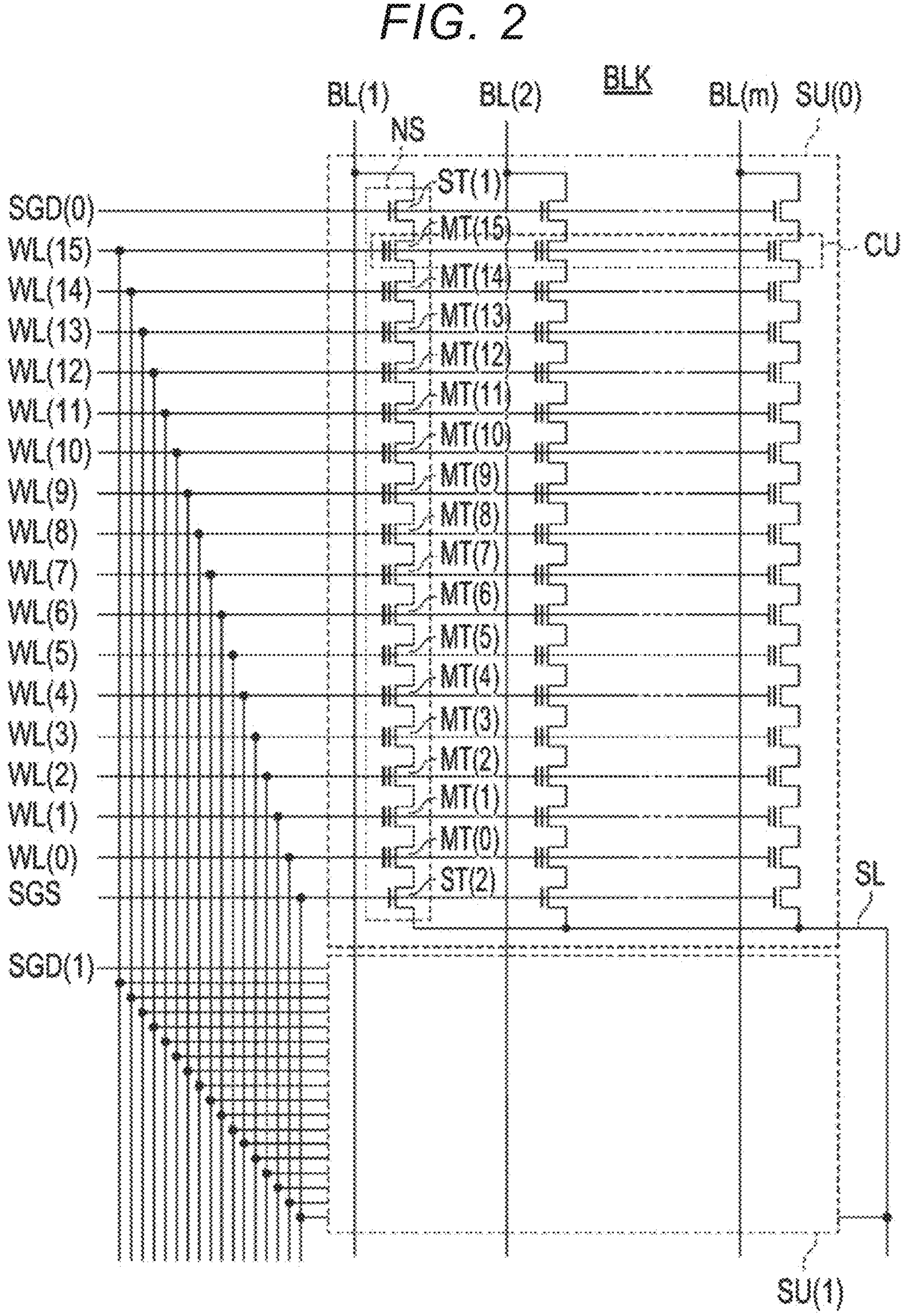
FIG. 2 is a diagram of a circuit configuration of a memory cell array in a semiconductor memory device according to a first embodiment.

FIG. 2 is a diagram illustrating an example of a circuit configuration of the memory cell array 10 provided in the semiconductor memory device 1 according to the first embodiment. One block BLK among the plurality of blocks BLKs in the memory cell array 10 is illustrated in FIG. 2. As illustrated in FIG. 2, the block BLK includes a plurality of string units SU (SU(0) to SU(k), where k is an integer greater than or equal to 1). Each string unit SU includes a plurality of NAND strings NS respectively associated with the bit lines BL(0) to BL(m), where m is an integer greater than or equal to 1. Each NAND string NS includes, for example, memory cell transistors MT(0) to MT(15) and select transistors ST(1) and ST (2). Each memory cell transistor MT includes a control gate and a charge storage layer and stores data in a non-volatile manner. Each of the select transistors ST(1) and ST (2) is used to select the string unit SU during various operations.

In each NAND string NS, the memory cell transistors MT(0) to MT(15) are connected in series. A drain of select transistor ST (1) is connected to an associated bit line BL, and a source of select transistor ST(1) is connected to one end of each of the memory cell transistors MT(0) to MT(15) connected in series. A drain of the select transistor ST (2) is connected to the other end of each of the memory cell transistors MT(0) to MT(15) connected in series. A source of the select transistor ST (2) is connected to a source line SL.

In the same block BLK, control gates of all the memory cell transistors MT(0) to MT(15) are connected in common to respective word lines WL(0) to WL(15). Gates of select transistors ST(1) in string units SU(0) to SU(k) are connected in common to respective select gate lines SGD (0) to SGD (k). Gates of the select transistors ST(2) are connected in common to a select gate line SGS.

In the circuit configuration of the memory cell array 10 described above, the bit line BL is shared by the NAND strings NS assigned the same column address in each string unit SU. The source line SL is shared, for example, among the plurality of blocks BLK.

A set (group) of memory cell transistors MT connected to a common word line WL in the same string unit SU is called a cell unit CU. For example, a storage capacity of the cell unit CU including memory cell transistors MT that each storing 1-bit data is referred to as "one page data" or one page worth of data. In some examples, the cell unit CU can have a storage capacity of two or more pages of data according to the number of bits of data that can be stored in each memory cell transistor MT.

The memory cell array 10 provided in the semiconductor memory device 1 according to the first embodiment is not limited to the circuit configuration described above. For example, the numbers of memory cell transistors MT and select transistors ST (1) and ST (2) in each NAND string NS can be designed to be any number. The number of string units SU in each block BLK may be designed to be any number.

Figure 3:
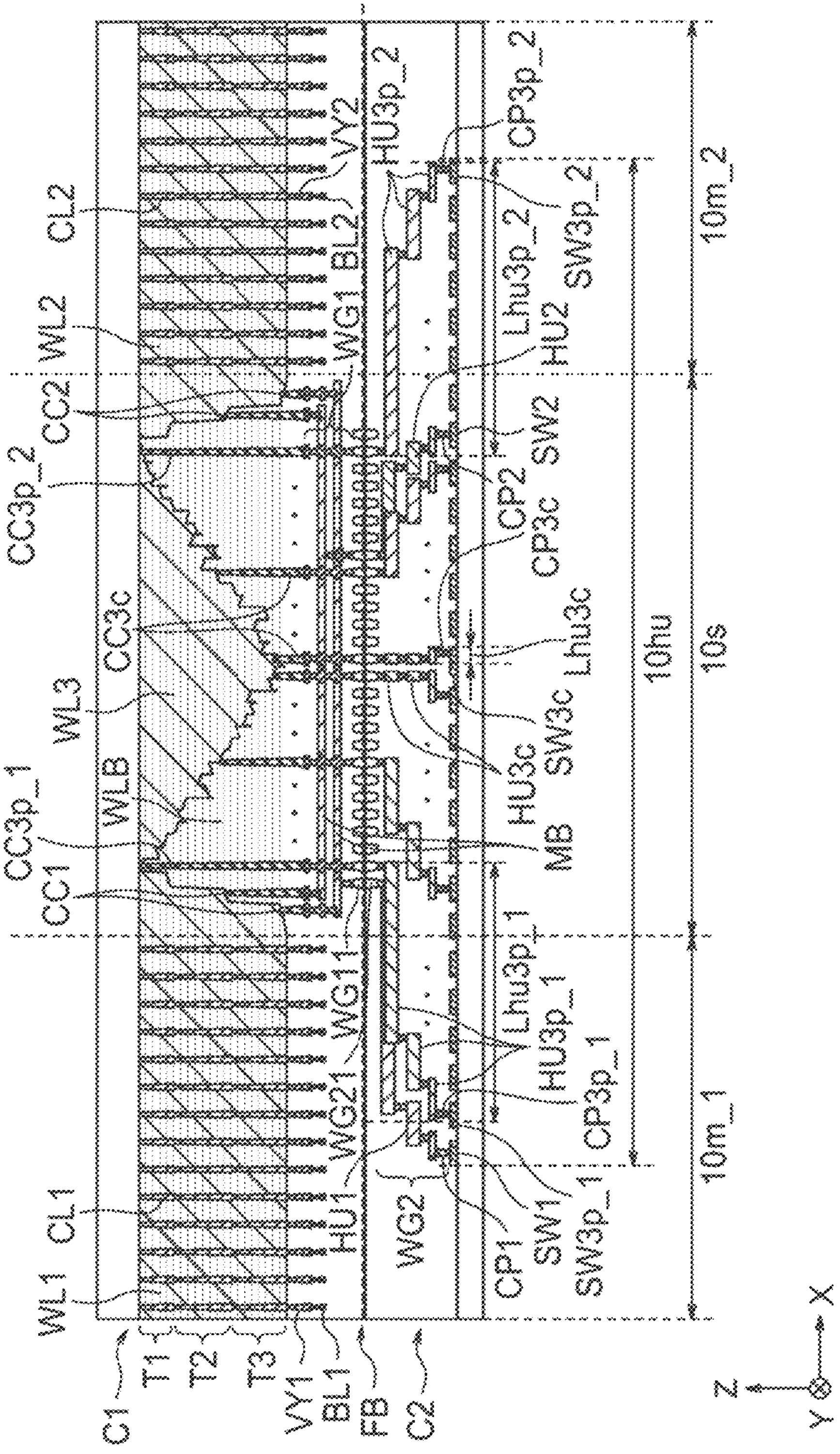
FIG. 3 is a cross-sectional view of a semiconductor memory device according to a first embodiment.

FIG. 3 is a cross-sectional view illustrating a configuration example of the semiconductor memory device 1 according to the first embodiment. The semiconductor memory device 1 is manufactured by bonding a memory chip C1 and a complementary metal oxide semiconductor (CMOS) chip C2 to each other. The memory chip C1 is a semiconductor chip including memory cell arrays 10*m*_1 and 10*m*_2 and a connection region 10*s*. The CMOS chip C2 is a semiconductor chip including peripheral circuits (for example, components denoted by the reference numerals 11 to 16 in FIG. 1). The memory chip C1 and the CMOS chip C2 are joined (bonded) at a sticking surface FB (bonding interface).

The memory chip C1 includes the memory cell arrays 10*m*_1 and 10*m*_2 and the connection region 10*s*.

The memory cell array 10*m*_1 includes a plurality of word lines WL1 stacked in the Z-direction and insulated from each other, and a plurality of columnar portions CL1 extending in the Z-direction through the plurality of word lines WL1. Each column portion CL1 is electrically connected to one of bit lines BL1 by a via contact VY1. The bit line BL1 is electrically connected to the sense amplifier module 16 on the CMOS chip C2 side via wiring (see FIG. 1).

The memory cell array 10*m*_2 includes a plurality of word lines WL2 stacked in the Z-direction and insulated from each other, and a plurality of columnar portions CL2 extending in the Z-direction through the plurality of word lines WL2. Each layer (level) of the word line WL2 corresponds in position to each layer (level) of the word line WL1. Each column portion CL2 is electrically connected to one of bit lines BL2 by a via contact VY2. The bit line BL2 is electrically connected to the sense amplifier module 16 on the CMOS chip C2 side via a wiring (see FIG. 1). The configurations of the memory cell arrays 10*m*_1 and 10*m*_2 may be the same.

Diameters of the columnar portions CL1 and CL2 become greater as the columnar portions CL1 and CL approach switches SW3*c*, SW3*p*_1 and SW3*p*_2 of the CMOS chip C2 in each of stack groups T1 to T3. Conversely, the diameters of the columnar portions CL1 and CL2 reduce in the +Z-direction in each of the stack groups T1 to T3.

The connection region 10*s* is provided between the memory cell array 10*m*_1 and the memory cell array 10*m*_2. The connection region 10*s* includes a plurality of word lines WL3 stacked in the Z-direction. The plurality of word lines WL3 are configured in a staircase shape so as to be closest to the CMOS chip C2 in an intermediate portion of the connection region 10s and away from the CMOS chip C2 at end portions closer to the memory cell arrays 10m_1 and 10m_2 on both sides of the connection region 10s than the intermediate portion of the connection region 10s. That is, the plurality of word lines WL3 are configured in a staircase shape so as to be spaced apart from the CMOS chip C2 as the word lines WL3 approach the memory cell arrays 10m_1 and 10m_2 from the intermediate portion of the connection region 10s. When viewed locally, the plurality of word lines WL3 are configured to approach the CMOS chip C2 in some locations as the word lines WL3 approach the memory cell arrays 10m_1 and 10m_2 from the intermediate portion. However, the overall tendency of the plurality of word lines WL3, as illustrated in FIG. 3, is that word lines WL3 are spaced apart from the CMOS chip C2 as the word lines WL3 approach the memory cell arrays 10m_1 and 10m_2 from the intermediate portion of the connection region 10s.

Each layer (level) of the word line WL3 corresponds to each layer (level) of the word line WL1 and each layer (level) of the word line WL2. That is, the word lines WL1 to WL3 are at substantially the same height in each of the respective corresponding layers. The respective layers of the word lines WL1 to WL3 are formed by processing continuous layers of the same material. Conductive metal such as, for example, copper or tungsten is used for the word lines WL1 to WL3. Hereinafter, layers of word lines WL1 to WL3 corresponding to each other will also be referred to as a word line layer or one word line layer.

In a word line layer, a word line WL3 is electrically connected to word lines WL1 and WL2 via a bridge portion WLB. The bridge portion WLB is formed by processing the same material layer forming the word lines WL1 to WL3. The bridge portion WLB is a layer left in the Y-direction when the word line WL3 is processed into the staircase shape, and is continuous with the word lines WL1 to WL3. Respective word lines WL1 to WL3 in a word line layer are electrically connected by the bridge portion WLB.

Among a plurality of word line layers, there may also be a word line layer in which a bridge portion WLB is not provided. A metal bridge MB may be provided between the word line WL1 and the word line WL2 in a word line layer that does not have a bridge portion WLB. The metal bridge MB is a wiring layer provided separately from the word line layers and electrically connects the word line WL1 and the word line WL2. Contact plugs CC1 and CC2 connected to the metal bridge MB are connected to the word lines WL1 and WL2 at both ends of the connection region 10s, respectively. The metal bridge MB is connected between the contact plug CC1 connected to the word line WL1 at one end of the connection region 10s and the contact plug CC2 connected to the word line WL2 at the other end of the connection region 10s. The contact plug CC1 is connected between the metal bridge MB and the word line WL1. The contact plug CC2 is connected between the metal bridge MB and the word line WL2.

Contact plugs CC3c, CC3p_1, and CC3p_2 connected to the word line WL3 are electrically connected to a wiring WG11 via a wiring WG1. The wiring WG11 is exposed on the sticking surface FB between the memory chip C1 and the CMOS chip C2. The wiring WG11 is joined to a wiring WG21 on the CMOS chip C2.

The CMOS chip C2 includes switches SW1, SW2, SW3c, SW3p_1, SW3p_2 and wirings WG2 and WG21. The switches SW1, SW2, SW3c, SW3p_1, and SW3p_2 are a part of the row decoder module 15 in FIG. 1, and are configured with field effect transistors (MOSFETs), for example. The switches SW1, SW2, SW3c, SW3p_1, and SW3p_2 are connected to the wiring WG21 via the wiring WG2. Each of the switches SW1, SW2, SW3c, SW3p_1, SW3p_2 applies a word line voltage to the word line layer (word lines WL1 to WL3) connected thereto. For example, a switch selected from a plurality of switches SW1, SW2, SW3c, SW3p_1, and SW3p_2 becomes conductive in a read operation, a write operation, or an erasing operation, and can apply the word line voltage to the selected word lines WL1 to WL3 in the same word line layer.

The plurality of switches SW1, SW2, SW3c, SW3p_1, and SW3p_2 are provided corresponding to each of the plurality of word line layers. The switch SW1 is electrically connected to the contact plug CC1 connected to a word line WL1. The word line WL1 is configured in the staircase shape at one end portion (end portion on the memory cell array 10m_1 side) of the connection region 10s. The contact plug CC1 is in contact from the Z-direction with a step surface (terrace region) provided on the staircase-shaped word line WL1.

The switch SW2 is electrically connected to the contact plug CC2 connected to a word line WL2. The word line WL2 is configured in the staircase shape at the other end portion (end portion on memory cell array 10m_2 side) of the connection region 10s. The contact plug CC2 is in contact from the Z-direction with a step surface (terrace region) provided on the staircase-shaped word line WL2.

Each of a plurality of switches SW3c, SW3p_1, and SW3p_2 is electrically connected to the contact plug CC3c connected to a word line WL3. When viewed from the direction (Z-direction) perpendicular to the sticking surface FB, the switch SW3c is provided at a position corresponding to the intermediate portion of the connection region 10s. The switch SW3p_1 is provided at a position corresponding to one end portion of the connection region 10s on the word line WL1 side when viewed in the Z-direction. The switch SW3p_2 is provided at a position corresponding to the other end portion of the connection region 10s on the word line WL2 side when viewed in the Z-direction. The word line WL3 is configured in the staircase shape so as to be closest to the switch SW3c in the intermediate portion of the connection region 10s and away from the switches SW3p_1 and SW3p_2 in the Z-direction toward end portions of the connection region 10s closer to the memory cell arrays 10m_1 and 10m_2. The contact plugs CC3c, CC3p_1, and CC3p_2 are in contact from the Z-direction with step surfaces (terrace regions) provided on the staircase-shaped word line WL3. The contact plug CC3c is in contact with the step surface of the word line WL3 in the intermediate portion of the connection region 10s, the contact plug CC3p_1 is in contact with the step surface of the word line WL3 in one end portion of the connection region 10s on the word line WL1 side, and the contact plug CC3p_2 is in contact with the step surface of the word line WL3 in the other end portion of the connection region 10s on the word line WL2 side. The switches SW3c, SW3p_1, and SW3p_2 correspond to the contact plugs CC3c, CC3p_1, and CC3p_2, respectively, and are electrically connected to the word lines WL3 respectively corresponding thereto via the contact plugs CC3c, CC3p_1, and CC3p_2.

The switches SW1, SW2, SW3c, SW3p_1, and SW3p_2 are arranged along the X-direction (corresponding to the arrangement direction of the memory cell array 10m_1, the connection region 10s, and the memory cell array 10m_2) on a semiconductor substrate of the CMOS chip C2. The length in the X-direction of the arrangement of the switches SW1, SW2, SW3c, SW3p_1, and SW3p_2 (also referred to collectively as a "switches group SW1") is longer than the length in the X-direction of the connection region 10_s_. The arrangement of the "switches group SW1" thus protrudes in the +X-directions beyond the connection region 10_s_ when viewed from the Z-direction over a region that may be referred to as hook-up region 10_hu_. The center of the arrangement of the "switches group SW1" in the X-direction substantially coincides with the center of the connection region 10_s_ in the X-direction. With this configuration, the switches SW1, SW2, SW3_c_, SW3_p__1, and SW3_p__2 are disposed so that a wiring distance to the word line WL3 is as short as possible.

The switch SW3_c_ is electrically connected to the contact plug CC3_c_ located at the intermediate portion of the connection region 10_s_. A word line WL3 for which a terrace region is closer to the intermediate portion of the connection region 10_s_ is electrically connected to the switch SW3_c_ closer to the intermediate portion. Therefore, the switch SW3_c_ has a small positional deviation (offset) in the X-direction with respect to the terrace region of the word line WL3 which is located in the intermediate portion and is connected to the contact plug CC3_c_. Therefore, a length Lhu3_c_ in the X-direction of a hook-up wiring HU3_c_ between the switch SW3_c_ and the word line WL3 connected thereto is relatively short.

The switches SW3_p__1 and SW3_p__2 are electrically connected to the contact plugs CC3_p__1 and CC3_p__2 located at both end portions of the connection region 10_s_, respectively. The word lines WL3_p__1 and WL3_p__2 for which terrace regions are closer to the end portions of the connection region 10_s_ are electrically connected to the switches SW3_p__1 and SW3_p__2 closer to the end portion of the arrangement of the "switches group SW1". Therefore, the switches SW3_p__1 and SW3_p__2 have a large positional deviation (offset) in the X-direction with respect to the terrace regions of the word line WL3 connected to the contact plugs CC3_p__1 and CC3_p__2. Accordingly, lengths Lhu3_p__1 and Lhu3_p__2 in the X-direction of hook-up wirings HU3_p__1 and HU3_p__2 between the switches SW3_p__1 and SW3_p__2 and the word lines WL3 connected thereto are longer than the length Lhu3_c_.

The hook-up wirings HU3_c_, HU3_p__1, and HU3_p__2 are configured as a part of the wiring WG2, and are wiring layers having a multilayer wiring structure in a hook-up region 10_hu_. Each of the hook-up wirings HU3_c_, HU3_p__1, and HU3_p__2 is configured with a plurality of metal wiring layers (for example, copper, tungsten, and the like). The length in the X-direction of the hook-up wirings HU3_c_, HU3_p__1, and HU3_p__2 is the total length in the X-direction of a plurality of wiring layers that configure each of the hook-up wirings HU3_c_, HU3_p__1, and HU3_p__2.

The hook-up wiring HU3_c_ is electrically connected between the switch SW3_c_ and the contact plug CC3_c_. When viewed from the Z-direction, the deviation in the X-direction between the switch SW3_c_ and the contact plug CC3_c_ is small, and thus the length in the X-direction of the hook-up wiring HU3_c_ is short. The hook-up wiring HU3_p__1 is electrically connected between the switch SW3_p__1 and the contact plug CC3_p__1. The hook-up wiring HU3_p__2 is electrically connected between the switch SW3_p__2 and the contact plug CC3_p__2. When viewed from the Z-direction, the deviation in the X-direction between the switch SW3_p__1 and the contact plug CC3_p__1 and the deviation in the X-direction between the switch SW3_p__2 and the contact plug CC3_p__2 are larger than the deviation in the X-direction between the switch SW3_c_ and the contact plug CC3_c_. Therefore, the lengths in the X-direction of the hook-up wirings HU3_p__1 and HU3_p__2 are longer than the length in the X-direction of the hook-up wiring HU3_c_. That is, the hook-up wiring HU3_c_ is shorter in length in the X-direction than the hook-up wirings HU3_p__1 and HU3_p__2.

A contact plug CP3_c_ is provided between a plurality of wiring layers including the hook-up wiring HU3_c_, and electrically connects the plurality of wiring layers. A contact plug CP3_p__1 is provided between a plurality of wiring layers including the hook-up wiring HU3_p__1, and electrically connects the plurality of wiring layers. A contact plug CP3_p__2 is provided between a plurality of wiring layers including the hook-up wiring HU3_p__2 and electrically connects the plurality of wiring layers. A conductive metal material such as copper or tungsten is used for the contact plugs CP3_c_, CP3_p__1, and CP3_p__2.

The wiring WG2 includes a plurality of hook-up wirings HU1, HU2, HU3_p__1, and HU3_p__2 and a plurality of contact plugs CP1, CP2, CP3_c_, CP3_p__1, and CP3_p__2.

The hook-up wirings HU1 and HU2 are respectively electrically connected between the metal bridge MB and the switch SW1 and between the metal bridge MB and the switch SW2. The switches SW1 and SW2 may be disposed at the ends of the arrangement of the switches SW1, SW2, SW3_c_, SW3_p__1, and SW3_p__2, or may be disposed at positions close to the middle of the arrangement.

The contact plug CP1 is provided between a plurality of wiring layers that configure the hook-up wiring HU1, and electrically connects the plurality of wiring layers. The contact plug CP2 is provided between a plurality of wiring layers including the hook-up wiring HU2, and electrically connects the plurality of wiring layers.

Figure 4:
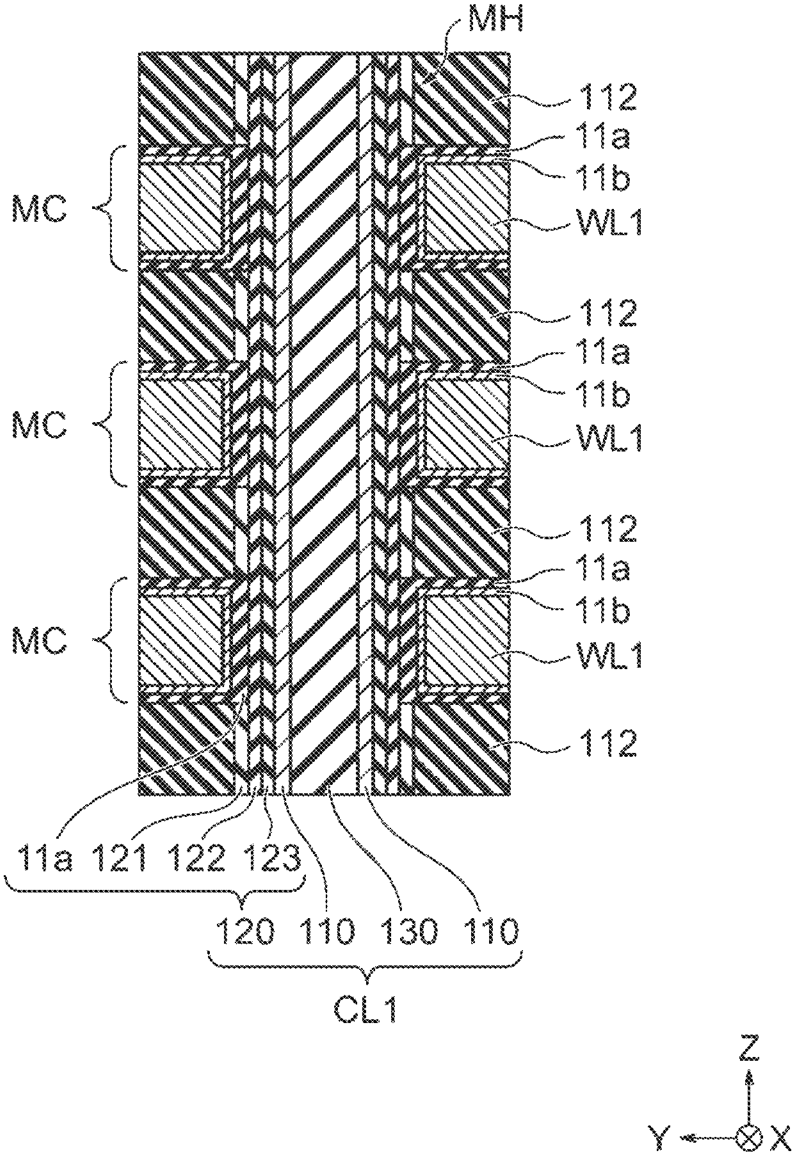
FIG. 4 is a schematic cross-sectional view of a memory cell of a memory cell array.
Figure 5:
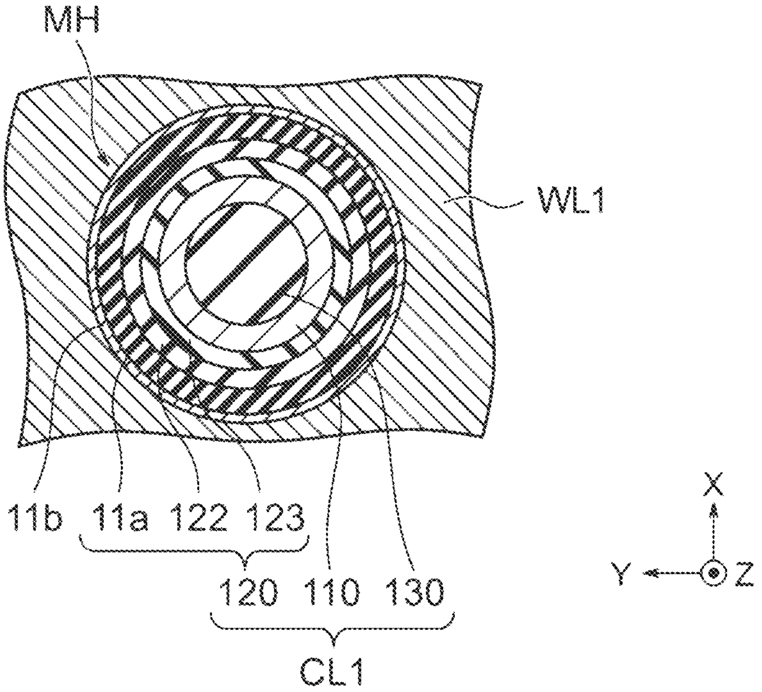
FIG. 5 is a schematic cross-sectional view of a memory cell of a memory cell array.

FIGS. 4 and 5 are schematic cross-sectional views illustrating configuration examples of memory cells MC of the memory cell arrays 10_m__1 and 10_m__2. Since the columnar portions CL1 and CL2 have the same configuration, only the columnar portion CL1 is described in FIGS. 4 and 5, but can be taken as representative of the columnar portion CL2 as well.

As illustrated in FIG. 4, the columnar portion CL1 is provided in a memory hole MH provided in the stacked word lines WL1 in the memory cell array 10_m__1. The columnar portion CL1 penetrates in the Z-direction from an upper end to a lower end of a stacked body of the word line WL1. The columnar portion CL1 includes a semiconductor body 110, a memory film 120, and a core layer 130. The columnar portion CL1 includes the core layer 130 provided at the center portion thereof, the semiconductor body 110 (semiconductor member) provided around the core layer 130, and the memory film 120 (charge storage member) provided around the semiconductor body 110. The semiconductor body 110 extends in the stacking direction (Z-direction) in the stacked body of the word lines WL1. One end of the semiconductor body 110 is electrically connected to a source layer or the like. The other end of the semiconductor body 110 is electrically connected to a bit line BL1. The memory film 120 is provided between the semiconductor body 110 and a word line WL1 and has a charge capturing portion.

As illustrated in FIG. 5, a shape of the memory hole MH in the XY plane can be, for example, a circle or an ellipse. A block insulating film 11_a_ forming a part of the memory film 120 may be provided between the word line WL1 and an insulating film 112. The block insulating film 11_a_ is, for example, a silicon oxide film or a metal oxide film. One example of metal oxide is aluminum oxide. A barrier film 11_b_ may be provided between the word line WL1 and the insulating film 112 and between the word line WL1 and the memory film 120. For the barrier film 11*b*, when the word line WL1 is made of tungsten, a stacked structure film of titanium nitride (TiN) and titanium (Ti) may be selected. The block insulating film 11*a* prevents back tunneling of charges from the word line WL1 to the memory film 120 side. The barrier film 11*b* also improves adhesion between the word line WL1 and the block insulating film 11*a*.

The shape of the semiconductor body 110 is, for example, cylindrical. A semiconductor material such as polysilicon, for example, is used for the semiconductor body 110. The semiconductor body 110 is, for example, undoped silicon. The semiconductor body 110 may also be p-type silicon. The semiconductor body 110 serves as a channel for each of the memory cells MC.

In the memory film 120, portions other than the block insulating film 11*a* are provided between an inner wall of the memory hole MH and the semiconductor body 110. The shape of the memory film 120 is, for example, cylindrical. A plurality of memory cells MC each have storage regions between the semiconductor body 110 and a word line WL1 and stacked in the Z-direction. The memory film 120 includes a cover insulating film 121, a charge capturing film 122, and a tunnel insulating film 123, for example. Each of the semiconductor body 110, the charge capturing film 122, and the tunnel insulating film 123 extends in the Z-direction.

The cover insulating film 121 is provided between the insulating film 112 and the charge capturing film 122. The cover insulating film 121 comprises, for example, silicon oxide. The cover insulating film 121 protects the charge capturing film 122 from being etched when replacing a sacrificial film with the word line WL1 in a replacement process used in manufacturing. The cover insulating film 121 may be removed in the replacement process. In this case, the block insulating film 11*a* is not provided between the word line WL1 and the charge capturing film 122. The cover insulating film 121 need not necessarily be provided when the replacement process is not used to form the word line WL1.

The charge capturing film 122 is provided between the block insulating film 11*a* and the tunnel insulating film 123 and between the cover insulating film 121 and the tunnel insulating film 123. The charge capturing film 122 comprises, for example, silicon nitride (SiN) and has trap sites in which charges are trapped. A portion of the charge capturing film 122 interposed between the word line WL1 and the semiconductor body 110 configures the storage region of the memory cell MC and functions as a charge capturing (storage) portion. A threshold voltage of the memory cell MC changes depending on the presence or absence of charges in the charge capturing portion or the amount of charge captured in the charge capturing portion. With this configuration, the memory cell MC stores information (data values).

The tunnel insulating film 123 is provided between the semiconductor body 110 and the charge capturing film 122. The tunnel insulating film 123 comprises, for example, silicon oxide, or silicon oxide and silicon nitride. The tunnel insulating film 123 serves as a potential barrier between the semiconductor body 110 and the charge capturing film 122. For example, when injecting electrons from the semiconductor body 110 into the charge capturing portion (e.g., a write operation) and when injecting holes from the semiconductor body 110 into the charge capturing portion (e.g., an erasing operation), the electrons and holes must pass through (tunnel) the potential barrier of the tunnel insulating film 123.

The core layer 130 fills an interior space of the cylindrical semiconductor body 110. The shape of the core layer 130 is, for example, columnar. The core layer 130 comprises, for example, silicon oxide and provides insulation performance.

Figure 6:
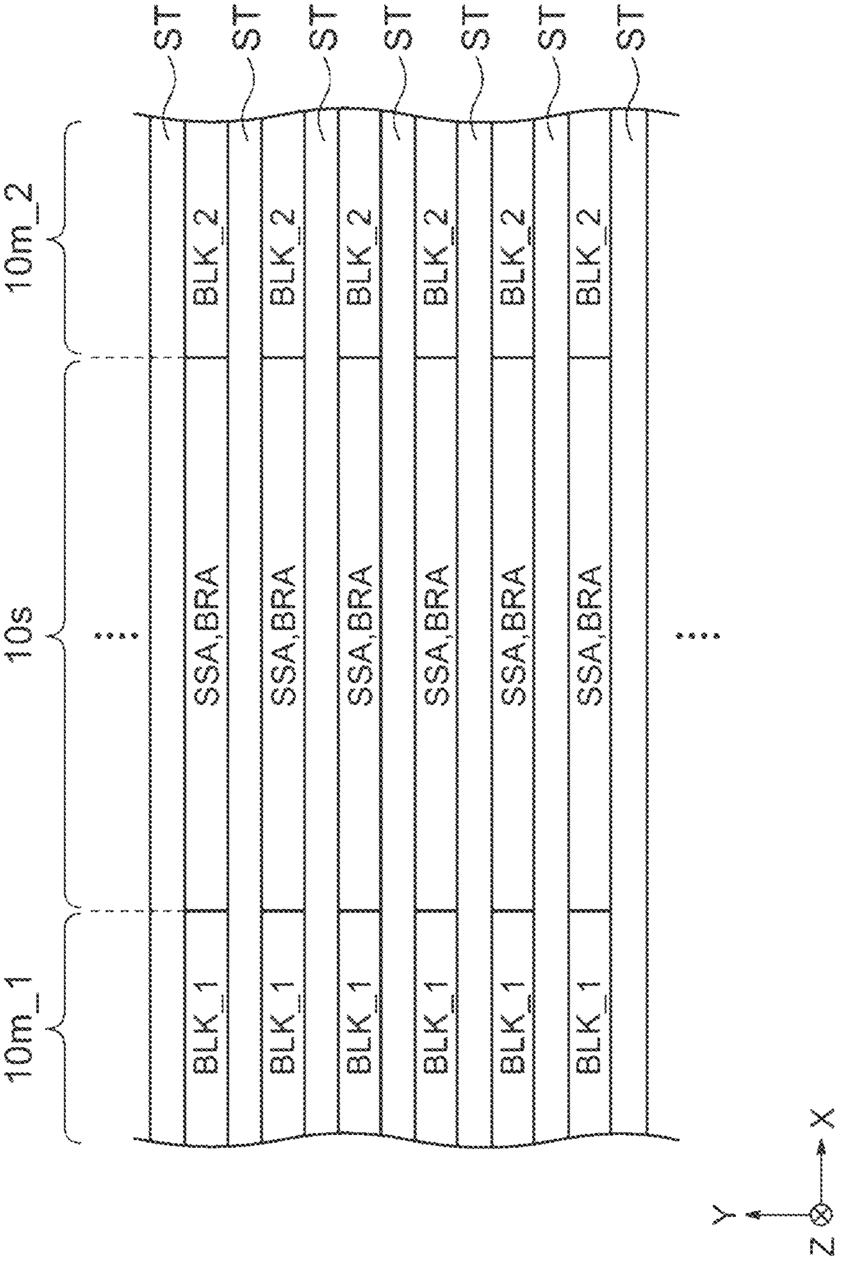
FIG. 6 is a schematic plan view illustrating a layout of a connection region and memory cell arrays.

FIG. 6 is a schematic plan view illustrating the layout of the connection region 10*s* and the memory cell arrays 10*m*_1 and 10*m*_2. The memory cell arrays 10*m*_1 and 10*m*_2 are adjacent to each other but with the connection region 10*s* interposed therebetween. Each of the memory cell arrays 10*m*_1 and 10*m*_2 includes a plurality of blocks BLK. In the Y-direction, the plurality of blocks BLK are electrically isolated from each other by slits ST extending in the X-direction.

Each portion of the memory cell array 10*m*_1 or 10*m*_2 between a pair of adjacent slits ST is called a block BLK. The block BLK is, for example, the minimum unit for data erase operations. Although not specifically depicted, each block BLK can be further divided into write and read units.

The memory cell array 10*m*_1 has a plurality of columnar portions CL1 The memory cell array 10*m*_2 has a plurality of columnar portions CL2/Thus, memory cell arrays 10*m*_1 and 10*m*_2 both include a plurality of memory cells MC arranged three-dimensionally. The memory cells MC are formed at the intersections of the word lines WL1 and WL2 with the columnar portions CL1 and CL2.

For convenience of description, any block BLK belonging to the memory cell array 10*m*_1 is referred to as a block BLK_1. Any block BLK belonging to the memory cell array 10*m*_2 is referred to as a block BLK_2.

The connection region 10*s* is provided between the memory cell array 10*m*_1 and the memory cell array 10*m*_2 in the X-direction. The connection region 10*s* includes a staircase region SSA and a bridge region BRA for each adjacent block BLK (a block BLK_1 and a block BLK_2).

The staircase regions SSA (and the bridge regions BRA) are adjacent to each other in the Y-direction across a slit ST. As illustrated in FIG. 6, the regions with staircase region SSA and the bridge region BRA are repeatedly provided in the Y-direction.

In the staircase region SSA, a plurality of word lines WL3 are formed in a staircase shape so as to be recessed in the +Z-direction from the intermediate portion of the connection region 10*s* toward both end portions thereof. Each of the plurality of word lines WL3 in the staircase region SSA has a terrace region (region of staircase-shaped surface) that does not overlap with other word line layers. The contact plugs CC3*c*, CC3*p*_1, and CC3*p*_2 (see FIG. 3) are in contact with respective terrace regions. Voltages can be separately applied to each of the word lines WL3 via the contact plugs CC3*c*, CC3*p*_1, and CC3*p*_2. Thus, the staircase regions SSA are provided as terrace regions for bringing the contact plugs CC3*c*, CC3*p*_1, and CC3*p*_2 into contact with the individual word lines WL3.

The contact plugs CC3*c*, CC3*p*_1, and CC3*p*_2 are electrically connected to the adjacent wirings WG11 (see FIG. 3) via wirings, respectively, and are electrically connected to the row decoder module 15 of the CMOS chip C2 via the wirings WG21. With this configuration, the row decoder module 15 can independently control the voltage of each word line WL3 via the wirings WG11 and WG21 and the contact plugs CC3*c*, CC3*p*_1, and CC3*p*_2 of the staircase region SSA.

In the bridge region BRA, a plurality of bridge portions WLB that respectively correspond to the plurality of word lines WL3 are stacked at intervals in the Z-direction. Each of the bridge portions WLB electrically connects a word line WL3 of the connection region 10*s*, a word line WL1 of the memory cell array 10*m*_1, and a word line WL2 of the memory cell array 10*m*_2 for each word line layer. Therefore, the memory cell arrays 10*m*_1 and 10*m*_2 can function as one unitary memory cell array via the electrical connections in connection region 10*s*.

Thus, by arranging the connection region 10*s* between the memory cell arrays 10*m*_1 and 10*m*_2, the contact plugs CC3*c*, CC3*p*_1, and CC3*p*_2 are located in the middle of the word lines WL1 to WL3, and the distances from the contact plugs CC3*c*, CC3*p*_1, and CC3*p*_2 to the end portions of the word lines WL1 to WL3 can be shortened. With this configuration, power can be quickly supplied to the end portions of the word lines WL1 to WL3, and voltage control of the word lines WL1 to WL3 is facilitated. Further, since the memory cell arrays 10*m*_1 and 10*m*_2 can be disposed on opposite sides of one connection region 10*s*, the scale of the memory cell array (storage capacity) can be increased while maintaining operation speed.

Figure 7:
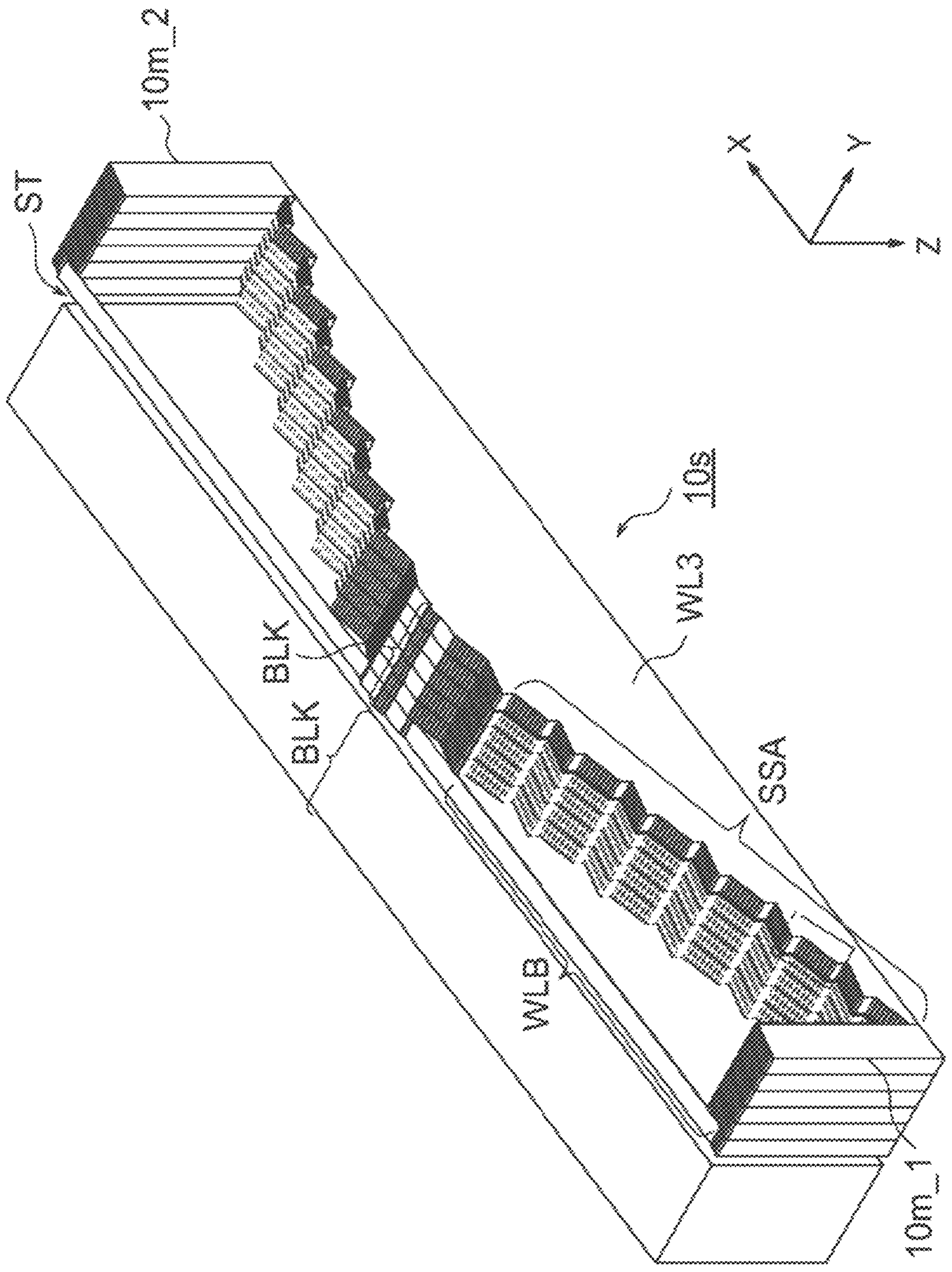
FIG. 7 is a perspective view schematically illustrating a connection region of a block.
Figure 8:
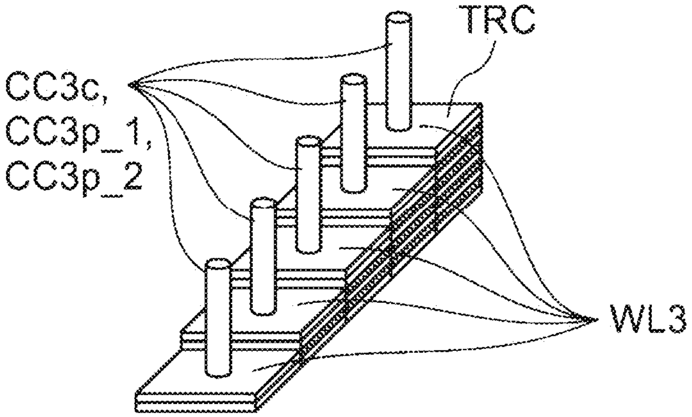
FIG. 8 is a perspective view schematically illustrating a connection region of a block.

FIGS. 7 and 8 are perspective views schematically illustrating an outline of the connection region 10*s* of a certain block BLK. FIGS. 7 and 8 illustrate the word lines WL3 upside down as compared to the orientation depicted in FIG. 3. As illustrated in FIG. 7, the staircase region SSA of the connection region 10*s* is a region in which the word lines WL3 are formed in a staircase shape. As illustrated in FIG. 8, the staircase region SSA has terrace regions TRC for connecting each of the plurality of contact plugs CC3*c*, CC3*p*_1, and CC3*p*_2 to the respective word lines WL3 in the plurality of word lines WL3.

A bridge portion WLB incorporates a portion of the plurality of word lines WL3, and electrically connects the word lines WL1 of the memory cell array 10*m*_1 and the word lines WL2 of the memory cell array 10*m*_2 for each word line layer with a corresponding word line WL3 therein. Accordingly, in the word line layer having a bridge portion WLB, the word lines WL1 to WL3 are electrically connected to each other.

The bridge portion WLB is provided adjacent to the staircase region SSA in the Y-direction (substantially perpendicular to the extending direction of the slit ST) within the connection region 10*s*, but is not recessed into a staircase shape.

In this embodiment, a word line WL3 is located at the highest position in the Z-direction at the central portion of the connection region 10*s*, and is recessed at the lowest position in the Z-direction at both end portions of the connection region 10*s*. That is, the word lines WL3 get closer to the CMOS chip C2 in the central portion of the connection region 10*s* and farthest from the CMOS chip C2 at the end portions of the connection region 10*s*.

Figure 9:
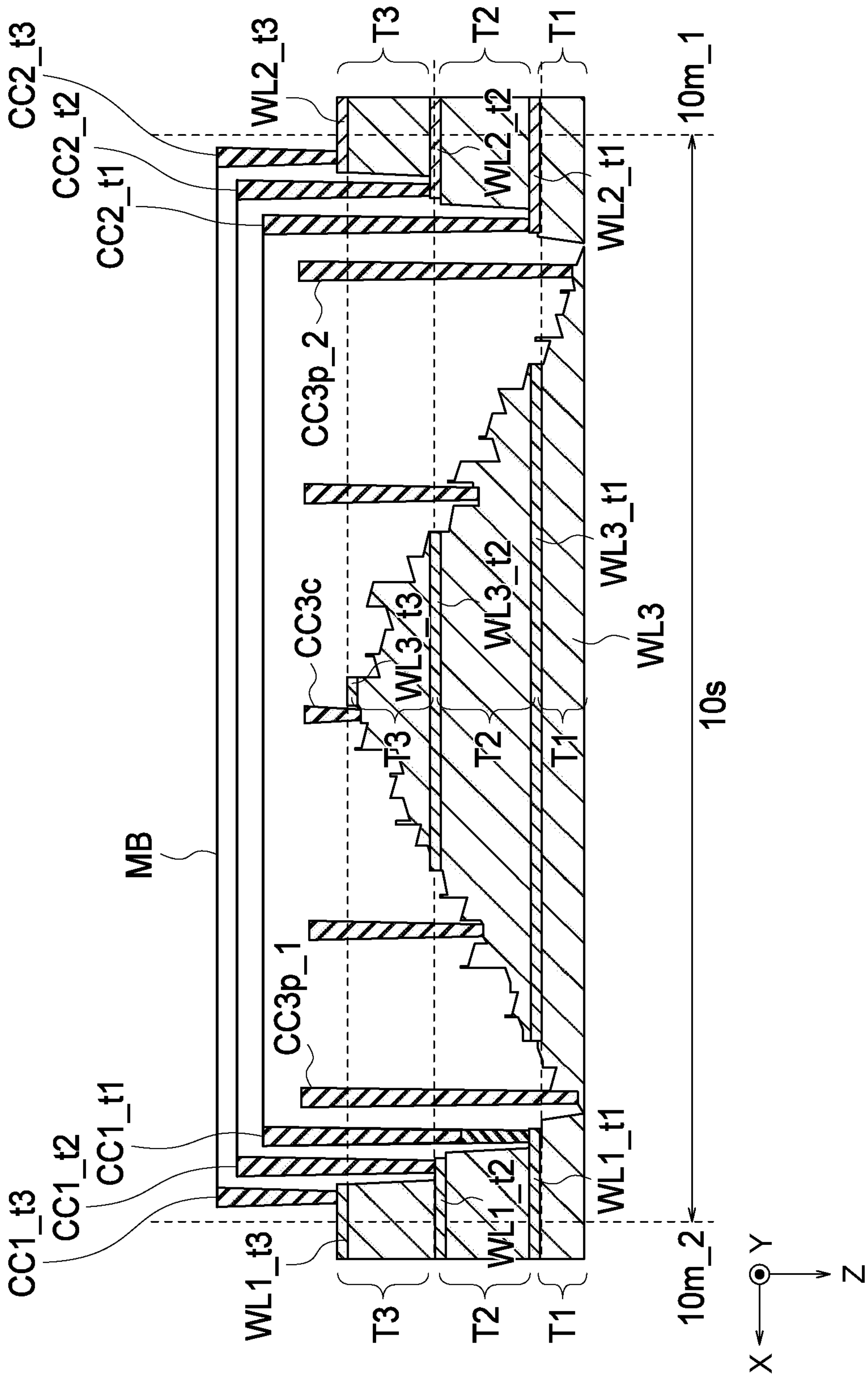
FIG. 9 is a cross-sectional view illustrating a configuration example of word lines.

FIG. 9 is a cross-sectional view illustrating a configuration example of the word lines WL1 to WL3. FIG. 9 illustrates the word lines WL3 upside down as compared to FIG. 3.

The word lines WL1 to WL3 are parts of a plurality of word line layers stacked in the Z-direction. In this example, the word lines WL1 to WL3 are all divided into three stack groups T1, T2, T3 stacked in the Z-direction. Each of the stack groups T1 to T3 can be individually formed. For example, as illustrated in FIG. 3, a portion of the columnar portion CL1 is separately formed in each of the stack groups T1 to T3. A portion of the columnar portion CL2 is also formed separately in the stack groups T1 to T3. Likewise, the word lines WL3 are also separately formed in each of the stack groups T1 to T3.

At least the uppermost word line layer of each of the stack groups T1 to T3 does not have a corresponding bridge portion WLB provided. That is, among the word line layers in each of the stack groups T1 to T3, the word line layer closest to the "switches group SW1" of the CMOS chip C2 does not have a bridge portion WLB provided. Therefore, the word lines WL1 to WL3 at the uppermost level of each of the stack groups T1 to T3 are electrically isolated from each other absent some other connectivity being provided.

Of the word lines WL1, the uppermost word line layers WL1_*t*1 to WL1_*t*3 closest to the "switches group SW1" in the stack groups T1 to T3 are connected to contact plugs CC1_*t*1 to CC1_*t*3, respectively. Of the word lines WL2, the uppermost word line layers WL2_*t*1 to WL2_*t*3 closest to the "switches group SW1" in the stack groups T1 to T3 are connected to the contact plugs CC2_*t*1 to CC2_*t*3, respectively. The contact plug CC1_*t*1 and the contact plug CC2_*t*1 are electrically connected to each other by a metal bridge MB. The contact plug CC1_*t*2 and the contact plug CC2_*t*2 are electrically connected to each other by another metal bridge MB. The contact plug CC1_*t*3 and the contact plug CC2_*t*3 are electrically connected to each other by another metal bridge MB. Accordingly, the uppermost word line layers WL1_*t*1 and WL2_*t*1 of the stack group T1 are electrically connected via the contact plugs CC1_*t*1 and CC2_*t*2 and a metal bridge MB without requiring a connection passing through the bridge portion WLB and the word lines WL3. The uppermost word line layers WL1_*t*2 and WL2_*t*2 of the stack group T2 are electrically connected via the contact plugs CC1_*t*2 and CC2_*t*2 and a metal bridge MB without requiring a connection passing through the bridge portion WLB and the word lines WL3. The uppermost word line layers WL1_*t*3 and WL2_*t*3 of stack group T3 are electrically connected via the contact plugs CC1_*t*3 and CC2_*t*3 and a metal bridge MB without requiring a connection passing through the bridge portion WLB and the word lines WL3.

The metal bridge MB electrically connects the uppermost word line layers WL1_*t*1 and WL2_*t*1 of the stack group T1. Another metal bridge MB electrically connects the uppermost word line layers WL1_*t*2 and WL2_*t*2 of the stack group T2. Another metal bridge MB electrically connects the uppermost word line layers WL1_*t*3 and WL2_*t*3 of the stack group T3. As illustrated in FIG. 3, the metal bridge MB can be electrically connected to the switch SW1 or SW2 of the CMOS chip C2 via the wirings WG11 and WG21, hook-up wirings HU1 and HU2, and the like. With respect to those word lines connected by a metal bridge MB, the word lines WL1 to WL3 of the stack groups T1 to T3 can be electrically isolated from each other.

Of the word lines WL3, the uppermost word line layers WL3_*t*1 to WL3_*t*3 closest to the switch "switches group SW1" in the stacked groups T1 to T3 are not connected to the bridge portion WLB. Therefore, the word lines WL3_*t*1 to WL3_*t*3 are electrically isolated from the word lines WL1 and WL2 and are left in an electrically floating state.

Of the word lines WL3, the word lines WL3 other than the uppermost word line layers of the stack groups T1 to T3 are electrically connected to the switches SW3*c*, SW3*p*_1, and SW3*p*_2 of the CMOS chip C2 illustrated in FIG. 3 via the contact plugs CC3*c*, CC3*p*_1, and CC3*p*_2, wirings WG11 and WG21, hook-up wirings HU3*c*, HU3*p*_1, and HU3_2, and the like.

Figure 10:
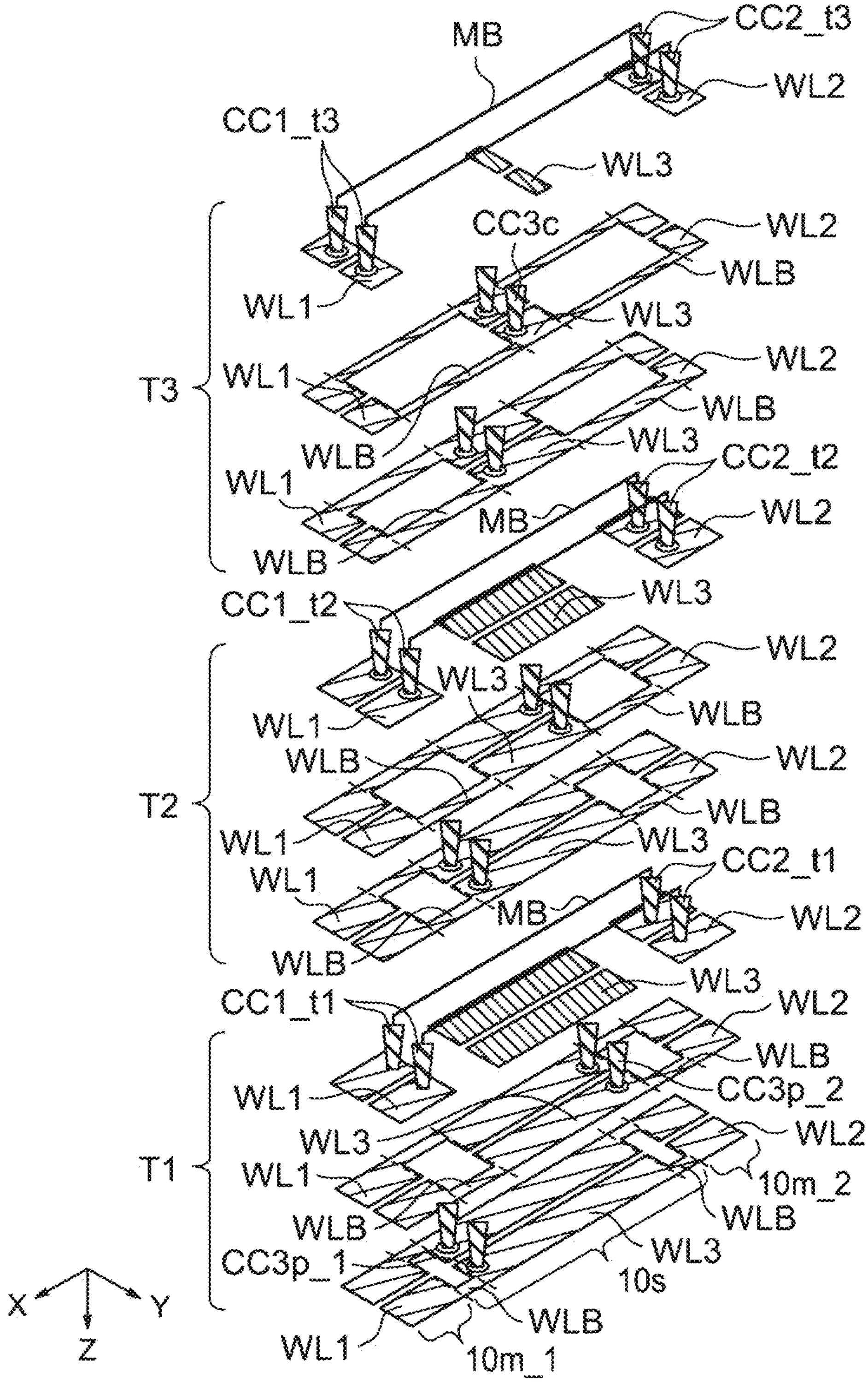
FIG. 10 is a perspective view illustrating a configuration example of word lines.

FIG. 10 is a perspective view illustrating a configuration example of the word lines WL1 to WL3. In FIG. 10, three layers are illustrated as word line layers within each of the stack groups T1 to T3 for the sake of convenience, but the number of word line layers in each stack group may be four or more. Although three stack groups are used in this embodiment, the number of stack groups may be two or less, or may be four or more.

In the lower word line layers relatively spaced apart from the CMOS chip C2, an interval between the word line WL3 and the word lines WL1 and WL2 is relatively narrow, and a length of the bridge portion WLB in the X-direction is short. On the other hand, in the upper word line layer relatively close to the CMOS chip C2, the interval between the word line WL3 and the word lines WL1 and WL2 is relatively wide, and the length of the bridge portion WLB in the X-direction is long. In this embodiment, the length of the bridge portion WLB is shorter in the lower word line layers farther from the "switches group SW1" of the CMOS chip C2. The bridge portion WLB becomes longer as the bridge portion WLB gets closer to the "switches group SW1". That is, the length of the bridge portion WLB is shorter at a position farther from the "switches group SW1" than at a position near the "switches group SW1".

Furthermore, in each of the stack groups T1 to T3, the width of the bridge portion WLB in the Y-direction becomes wider in the lower layers the farther from the CMOS chip C2 and becomes narrower as the bridge portion WLB gets closer to the CMOS chip C2. The uppermost word line layer of each of the stack groups T1 to T3 has no bridge portion WLB, as described above. This is because an etching process and a photoresist slimming process are repeatedly performed when the word lines WL3 are processed into the staircase shape. In each of the stack groups T1 to T3, the width of the bridge portions WLB becomes narrower from the lower layer toward the upper layer, and the bridge portion WLB ultimately disappears at the uppermost layer during the processing. The photoresist is re-applied for each of the stack groups T1 to T3, and the word lines WL3 are processed for each of the stack groups T1 to T3. Accordingly, the bridge portion WLB of the uppermost layer of each of the stack groups T1 to T3 is removed in manufacturing. In the uppermost word line layer, the word line WL3 is left in an electrically floating state. The uppermost word line layers WL1 and WL2 are not connected by the bridge portion WLB, but are electrically connected to each other via the metal bridge MB.

In this embodiment, for the uppermost word line layer of each of the stack groups T1 to T3, instead of the bridge portion WLB, a metal bridge MB electrically connects the word line WL1 and the word line WL2. In some examples, more than just the word line layers of the uppermost layer of each of the stack groups T1 to T3 may utilize a metal bridge MB connection to electrically connect the word line WL1 and the word line WL2 instead of a bridge portion WLB.

In this embodiment, as illustrated in FIG. 9, the word line WL3 is formed in the staircase shape so as to be close to the CMOS chip C2 at the intermediate portion of the connection region 10*s* and to be spaced away from the CMOS chip C2 at the end portions thereof. Therefore, as illustrated in FIG. 10, the length of the bridge portion WLB in the X-direction is shorter in the lower word line layers farther from the CMOS chip C2, and the bridge portions WLB becomes longer as the bridge portion WLB gets closer to the CMOS chip C2. Moreover, in each of the stack groups T1 to T3, the width of the bridge portion WLB in the Y-direction is wider in the lower layers farther from the CMOS chip C2 and becomes narrower as the bridge portion WLB gets closer to the CMOS chip C2. Therefore, the resistance of the bridge portions WLB of the word lines WL3 is lower in the lower word line layers farther from the CMOS chip C2, and becomes higher as the bridge portions WLB get closer to the CMOS chip C2.

As illustrated in FIG. 3, the diameters of the columnar portions CL1 and CL2 (dimension in the X- or Y-direction) are tapered so as to become narrower in the +Z-direction within each of the stack groups T1 to T3. Accordingly, areas of the word lines WL1 and WL2 become larger. Therefore, the resistance of the word lines WL1 and WL2 becomes lower in the +Z-direction within each of the stack groups T1 to T3. Conversely, the resistance of the word lines WL1 and WL2 increases in the −Z-direction within each of the stack groups T1 to T3. That is, the resistance of the word lines WL1 and WL2 gets lower in the lower word line layers farther from the CMOS chip C2 within each of the stack groups T1 to T3, and becomes higher as the word lines WL1 and WL2 approach the CMOS chip C2.

Although not particularly limited, the contact plugs CC3*c*, CC3*p*_1, and CC3*p*_2 may be disposed alternately between one end portion and the other end portion of the connection region 10*s* for each word line layer. That is, the contact plugs CC3*c*, CC3*p*_1, and CC3*p*_2 are disposed at one end portion of the connection region 10*s* (memory cell array 10*m*_1 side) for odd-numbered word line layers, and disposed at the other end portion of the connection region 10*s* (memory cell array 10*m*_2 side) for even-numbered word line layers.

Figure 11:
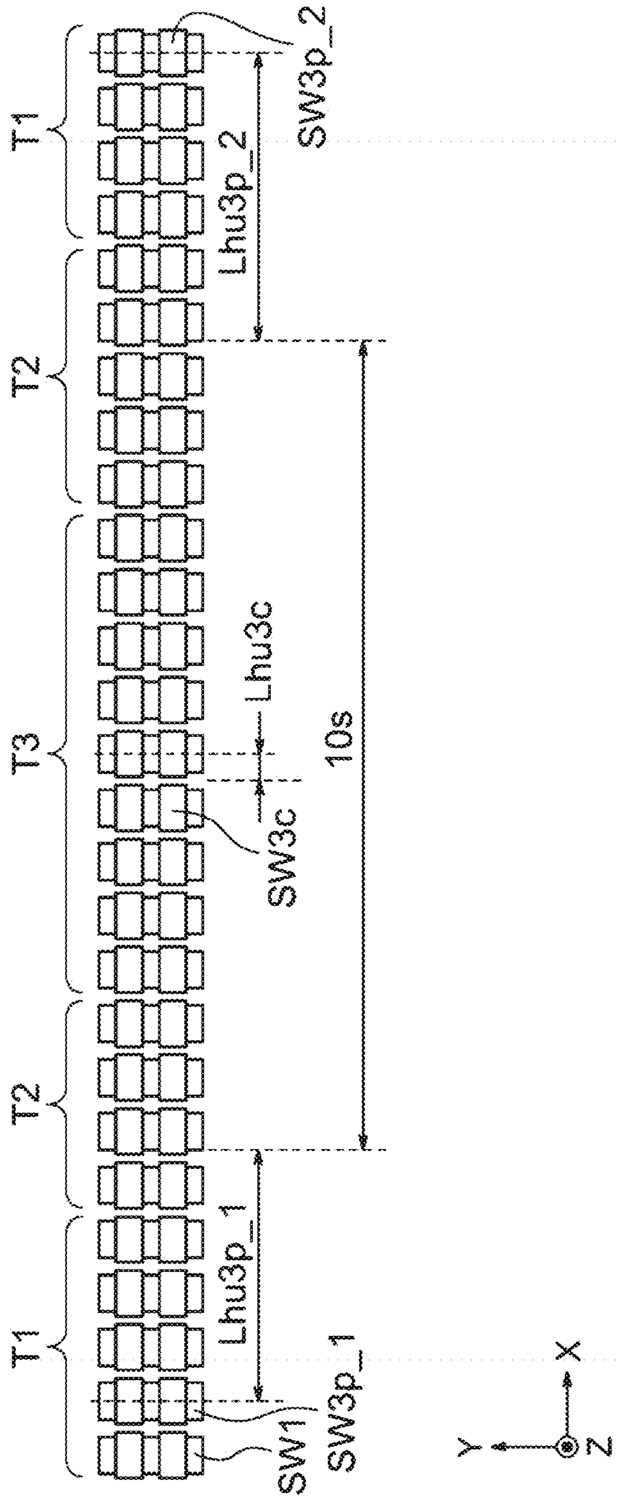
FIG. 11 is a schematic diagram illustrating a correspondence relationship between an arrangement of switches and stacked groups of word lines.

FIG. 11 is a schematic diagram illustrating the arrangement of the "switches group SW1". The intermediate (middle) portion of the connection region 10*s* corresponds to an intermediate (middle) portion of the arrangement of the "switches group SW1". The word line WL3 located in the intermediate portion of the connection region 10*s* is electrically connected to the switch SW3*c* located in the intermediate portion of the arrangement of the "switches group SW1". Accordingly, the length of the hook-up wiring HU3*c* in the X-direction is relatively short.

The end portions of the connection region 10*s* correspond to the end portions of the arrangement of the "switches group SW1". The word lines WL3 located at the end portions of the connection region 10*s* are electrically connected to the switches SW3*p*_1 and SW3*p*_2 located at the end portions of the arrangement of the "switches group SW1". Accordingly, the lengths of hook-up wiring HU3*p*_1 and HU3*p*_2 in the X-direction are relatively long. Therefore, the resistance of the hook-up wiring is low in the intermediate portion of the connection region 10*s* or in the intermediate portion of the arrangement of the "switches group SW1", but becomes higher toward both end portions thereof.

The resistance of the bridge portion WLB and the resistance of the hook-up wiring have opposite tendencies to each other according to the distance in the X-direction from the intermediate portion of the connection region 10*s* or the intermediate portion of the arrangement of the "switches group SW1". That is, in the intermediate portion of the connection region 10*s* or the intermediate portion of the arrangement of the "switches group SW1", the resistance of the bridge portion WLB is high, but the resistance of the hook-up wiring HU3*c* is low. At the end portions of the connection region 10*s* or the end portions of the arrangement of the "switches group SW1", the resistance of the bridge portion WLB is low, but the resistance of the hook-up wiring HU3*c* is high. In each of the stack groups T1 to T3, the resistance of the word lines WL1 and WL2 becomes higher as the word lines WL1 and WL2 get closer to the CMOS chip C2, similarly to the bridge portion WLB. With this configuration, the resistance of the bridge portion WLB, the resistance of the word lines WL1 and WL2, and the resistance of the hook-up wirings HU3, HU3*p*_1, and HU3*p*_2 complement (balance) each other, and the variations (differences) in the resistance from the switches SW3*c*, SW3*p*_1, and SW3*p*_2 to the word lines WL1 and WL2 can be reduced overall. As a result, the voltage controllability of the word lines WL1 and WL2 can be made substantially uniform.

In this device form, the length (distance) of the bridge portion WLB from the word line WL3 to the word line WL2 or the word line WL1 connected by the contact plugs CC3*c*, CC3*p*_1, and CC3*p*_2 can be approximately the same for each word line. That is, the resistances of the bridge portions WLB from the word line WL3 to the word line WL2 and from the word line WL3 to the word line WL1 become substantially equal, and this also contributes to making the voltage controllability of the word lines WL1 and WL2 uniform.

When variations in resistance from the switch of the decoder to the word line are large and the voltage controllability of the word line is locally poor, the voltage controllability of the entire semiconductor memory device is limited by this local voltage controllability of the word line.

In contrast, in this embodiment, the resistance of the bridge portion WLB, the resistance of the word lines WL1 and WL2, and the resistance of the hook-up wirings HU3*c*, HU3*p*_1, and HU3*p*_2 can be set to reduce variations in resistance from the switches SW3*c*, SW3*p*_1, and SW3*p*_2 to the word lines WL1 and WL2. With this configuration, the voltage controllability of the word lines WL1 and WL2 can be prevented from being locally deteriorated, and can be made substantially uniform. As a result, the semiconductor memory device according to this embodiment can improve the voltage controllability of the word line.

In the arrangement of the "switches group SW1", the switch SW3*c* corresponding to the stack group T3 of the word line WL3 is disposed in the intermediate portion of the connection region 10*s* (or alternately stated, in the intermediate portion of the arrangement of the "switches group SW1"). The switch SW3*c* corresponding to the stack group T2 of the word line WL3 is provided on both sides of the switch SW3*c* corresponding to the stack group T3. The switches SW3*c*, SW3*p*_1, and SW3*p*_2 corresponding to the stack group T1 of the word line WL3 are provided on both sides of the switches SW3*c* corresponding to the stack groups T2 and T3. In this way, the switches SW3*c*, SW3*p*_1, and SW3*p*_2 corresponding to the stack groups T3, T2, and T1 of the word line WL3 are spaced apart in the X-direction from the intermediate portion of the connection region 10*s* (or the intermediate portion of the arrangement of the "switches group SW1"). With this configuration, as described above, the resistance of the bridge portion WLB and the resistance of the hook-up wiring have opposite tendencies to each other according to the distance in the X-direction from the intermediate portion of the connection region 10*s* (or the intermediate portion of the arrangement of the "switches group SW1").

Figure 12:
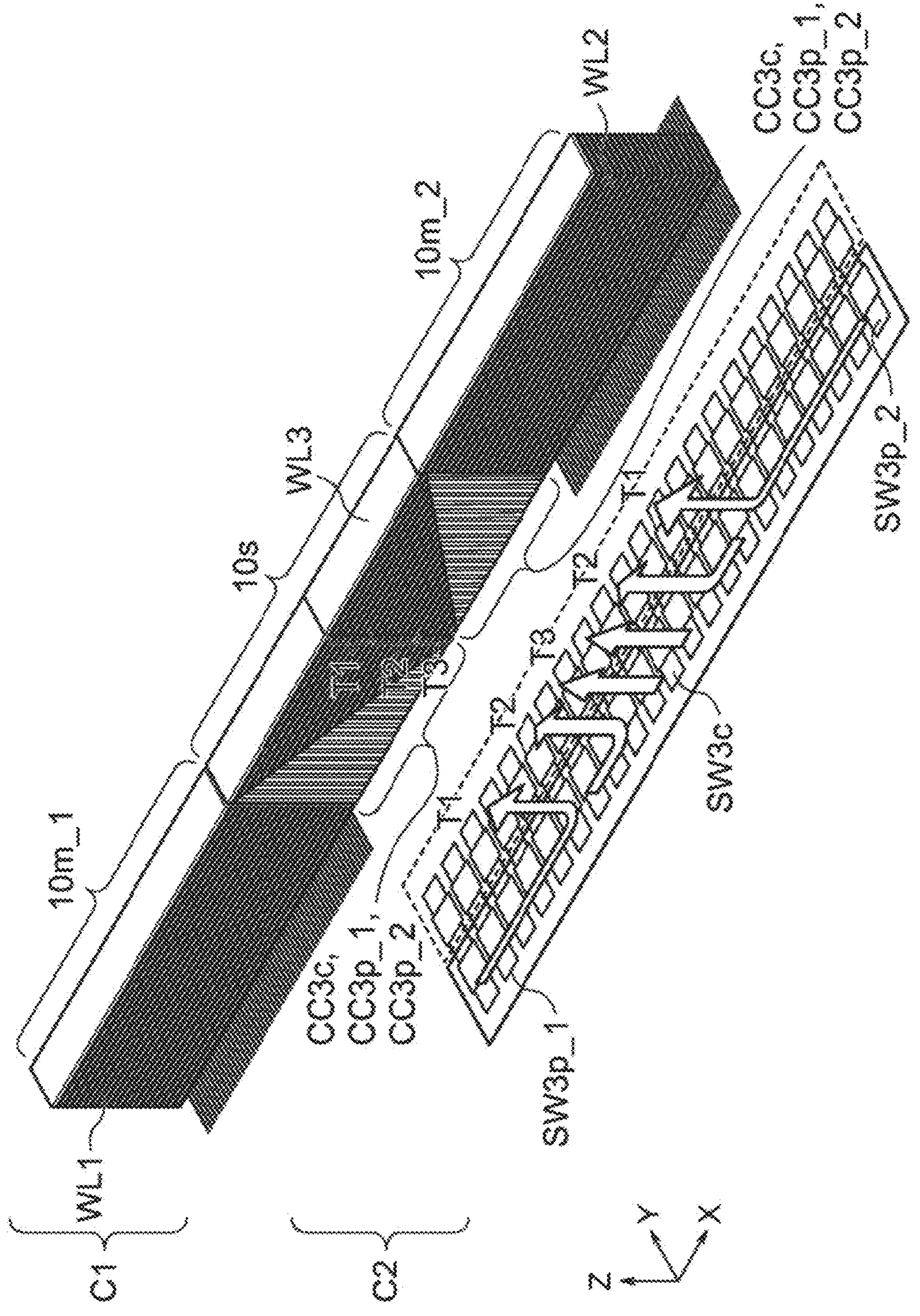
FIG. 12 is a conceptual diagram illustrating positional relationship between switches and word lines.

FIG. 12 is a conceptual diagram illustrating the positional relationship between the switches SW3*c*, SW3*p*_1, and SW3*p*_2 and the word lines WL1 to WL3. The word lines WL1 to WL3 are provided above the switches SW3*c*, SW3*p*_1, and SW3*p*_2 (+Z-direction).

The word line WL3 is formed in the staircase shape so as to get closer to the CMOS chip C2 at the intermediate portion of the connection region 10*s* and to be farther away from the CMOS chip C2 at the end portions thereof.

The stack group T3 of the word line WL3 is electrically connected to the switch SW3*c* located in the intermediate portion of the connection region 10*s*. Therefore, as described with reference to FIG. 3, the length of the hook-up wiring HU3*c* is relatively short.

The stack group T1 of the word line WL3 is electrically connected to the switches SW3*p*_1 and SW3*p*_2 located at the end portions of the connection region 10*s*. Therefore, as described with reference to FIG. 3, the lengths of the hook-up wirings HU3*p*_1 and HU3*p*_2 are relatively long.

The stack group T2 of the word line WL3 is electrically connected to the switch SW3*c* located between the intermediate portion and the end portions of the connection region 10*s*. Therefore, as described with reference to FIG. 3, the length of the hook-up wiring HU3*c* corresponding to the stack group T2 is relatively long.

Thus, the length of the hook-up wiring becomes longer as the distance from the intermediate portion of the connection region 10*s* becomes longer. With this configuration, the variations in resistance from the switches SW3*c*, SW3*p*_1, and SW3*p*_2 to the word lines WL1 and WL2 can be reduced. Therefore, the voltage controllability of the word lines WL1 and WL2 can be prevented from being locally deteriorated, and can be substantially uniformed as a whole. As a result, the semiconductor memory device according to this embodiment can improve the voltage controllability of the word line.

The example embodiments are illustrative, and the scope of the present disclosure is not limited thereto.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:

a first region which includes:

a plurality of first conductive layers stacked in a first direction and insulated from each other, first columnar portions extending in the first direction through the plurality of first conductive layers, and memory cells at intersections of the first conductive layers and the first columnar portions;

a second region which includes:

a plurality of second conductive layers stacked in the first direction and insulated from each other, second columnar portions extending in the first direction through the plurality of second conductive layers, and memory cells at intersections of the second conductive layers and the second columnar portions;

a third region between the first and second regions in a second direction perpendicular to the first direction, the third region including:

a plurality of third conductive layers stacked in the first direction and insulated from each other, the third conductive layers being between the first conductive layers and the second conductive layers in the second direction;

a plurality of switches arranged along the second direction, the plurality of switches being below the first, second, and third regions in the first direction; and a plurality of first contacts electrically connecting the plurality of third conductive layers to the plurality of switches, wherein the plurality of third conductive layers are configured in a staircase shape to be closest, in the first direction, to the plurality of switches in a middle portion of the third region, and farthest from, in the first direction, the plurality of switches at an end portion closer to the first or second region, the pluralities of first, second, and third conductive layers are each divided along the first direction into at least a first stack group, the third conductive layer closest to the plurality of switches among the plurality of third conductive layers of the first stack group is in an electrically floating state, and the semiconductor memory device further comprises a first bridge wiring electrically connecting a first conductive layer closest to the plurality of switches among the plurality of first conductive layers of the first stack group and a second conductive layer closest to the plurality of switches among the plurality of second conductive layers of the first stack group.

2. The semiconductor memory device according to claim 1, wherein one or more of the plurality of third conductive layers includes a bridge portion electrically connecting the corresponding first and second conductive layers and a terrace region contacting one of the plurality of first contacts, and the third conductive layer with the terrace region closer to the middle portion of the third region is electrically connected to a switch in the plurality of switches that is closer to the middle portion of the third region.

3. The semiconductor memory device according to claim 2, wherein the third conductive layer with the terrace region closest to the end portion of the third region is electrically connected to a switch in the plurality of switches that is at an end of the plurality of switches.

4. The semiconductor memory device according to claim 3, further comprising:

a plurality of first wirings electrically connected to the plurality of first contacts and the plurality of switches, respectively, wherein the first wiring electrically connected to the terrace region closest to the middle portion of the third region is shorter than the first wiring electrically connected to the terrace region closer to the end portion of the third region.

5. The semiconductor memory device according to claim 3, wherein a length of the bridge portions in the second direction is shorter at positions farther from the plurality of switches than at positions closer to the plurality of switches.

6. The semiconductor memory device according to claim 3, wherein the pluralities of first, second, and third conductive layers are each further divided along the first direction into a second stack group, the third conductive layer closest to the plurality of switches among the plurality of third conductive layers of the first stack group does not have a corresponding bridge portion, and the third conductive layer closest to the plurality of switches among the plurality of third conductive layers of the second stack group does not have a corresponding bridge portion.

7. The semiconductor memory device according to claim 6, wherein the third conductive layer closest to the plurality of switches among the plurality of third conductive layers of the second stack group is in an electrically floating state.

8. The semiconductor memory device according to claim 6, further comprising:

a second bridge wiring electrically connecting a first conductive layer closest to the plurality of switches among the plurality of first conductive layers of the second stack group and a second conductive layer closest to the plurality of switches among the plurality of second conductive layers of the second stack group.

9. The semiconductor memory device according to claim 8, further comprising:

a second contact connecting the first bridge wiring and the first conductive layer closest to the plurality of switches among the plurality of first conductive layers of the first stack group;

a third contact connecting the first bridge wiring and the second conductive layer closest to the plurality of switches among the plurality of second conductive layers of the first stack group;

a fourth contact connecting the second bridge wiring and the first conductive layer closest to the plurality of switches among the plurality of first conductive layers of the second stack group; and a fifth contact connecting the second bridge wiring and the second conductive layer closest to the plurality of switches among the plurality of second conductive layers of the second stack group.

10. The semiconductor memory device according to claim 2, further comprising:

a plurality of first wirings electrically connected to the plurality of first contacts and the plurality of switches, respectively, wherein the first wiring electrically connected to the terrace region closest to the middle portion of the third region is shorter than the first wiring electrically connected to the terrace region closer to the end portion of the third region.

11. The semiconductor memory device according to claim 2, wherein a length of the bridge portions in the second direction is shorter at positions farther from the plurality of switches than at positions closer to the plurality of switches.

12. The semiconductor memory device according to claim 2, wherein the pluralities of first, second, and third conductive layers are each further divided along the first direction into a second stack group, the third conductive layer closest to the plurality of switches among the plurality of third conductive layers of the first stack group does not have a corresponding bridge portion, and the third conductive layer closest to the plurality of switches among the plurality of third conductive layers of the second stack group does not have a corresponding bridge portion.

13. The semiconductor memory device according to claim 12, wherein the third conductive layer closest to the plurality of switches among the plurality of third conductive layers of the second stack group is in an electrically floating state.

14. The semiconductor memory device according to claim 12, further comprising:

a second bridge wiring electrically connecting a first conductive layer closest to the plurality of switches among the plurality of first conductive layers of the second stack group and a second conductive layer closest to the plurality of switches among the plurality of second conductive layers of the second stack group.

15. The semiconductor memory device according to claim 14, further comprising:

a second contact connecting the first bridge wiring and the first conductive layer closest to the plurality of switches among the plurality of first conductive layers of the first stack group;

a third contact connecting the first bridge wiring and the second conductive layer closest to the plurality of switches among the plurality of second conductive layers of the first stack group;

a fourth contact connecting the second bridge wiring and the first conductive layer closest to the plurality of switches among the plurality of first conductive layers of the second stack group; and a fifth contact connecting the second bridge wiring and the second conductive layer closest to the plurality of switches among the plurality of second conductive layers of the second stack group.

16. A semiconductor device, comprising:

a memory controller; and a semiconductor memory device connected to the memory controller, the semiconductor memory device including:

a first region which includes:

a plurality of first conductive layers stacked in a first direction and insulated from each other, first columnar portions extending in the first direction through the plurality of first conductive layers, and memory cells at intersections of the first conductive layers and the first columnar portions;

a second region which includes:

a plurality of second conductive layers stacked in the first direction and insulated from each other, second columnar portions extending in the first direction through the plurality of second conductive layers, and memory cells at intersections of the second conductive layers and the second columnar portions;

a third region between the first and second regions in a second direction perpendicular to the first direction, the third region including:

a plurality of third conductive layers stacked in the first direction and insulated from each other, the third conductive layers being between the first conductive layers and the second conductive layers in the second direction;

a plurality of switches arranged along the second direction, the plurality of switches being below the first, second, and third regions in the first direction; and a plurality of first contacts electrically connecting the plurality of third conductive layers to the plurality of switches, wherein the plurality of third conductive layers are configured in a staircase shape to be closest, in the first direction, to the plurality of switches in a middle portion of the third region, and farthest from, in the first direction, the plurality of switches at an end portion closer to the first or second region, the pluralities of first, second, and third conductive layers are each divided along the first direction into at least a first stack group, the third conductive layer closest to the plurality of switches among the plurality of third conductive layers of the first stack group is in an electrically floating state, and the semiconductor memory device further includes a first bridge wiring electrically connecting a first conductive layer closest to the plurality of switches among the plurality of first conductive layers of the first stack group and a second conductive layer closest to the plurality of switches among the plurality of second conductive layers of the first stack group.

17. The semiconductor device according to claim 16, wherein one or more of the plurality of third conductive layers includes a bridge portion electrically connecting the corresponding first and second conductive layers and a terrace region contacting one of the plurality of first contacts, and the third conductive layer with the terrace region closer to the middle portion of the third region is electrically connected to a switch in the plurality of switches that is closer to the middle portion of the third region.

18. The semiconductor device according to claim 17, wherein the third conductive layer with the terrace region closest to the end portion of the third region is electrically connected to a switch in the plurality of switches that is at an end of the plurality of switches.

19. The semiconductor device according to claim 17, further comprising:

a plurality of first wirings electrically connected to the plurality of first contacts and the plurality of switches, respectively, wherein the first wiring electrically connected to the terrace region closest to the middle portion of the third region is shorter than the first wiring electrically connected to the terrace region closer to the end portion of the third region.

20. The semiconductor device according to claim 17, wherein a length of the bridge portions in the second direction is shorter at positions farther from the plurality of switches than at positions closer to the plurality of switches.

21. A semiconductor memory device, comprising:

a first region which includes:

a plurality of first conductive layers stacked in a first direction and insulated from each other, first columnar portions extending in the first direction through the plurality of first conductive layers, and memory cells at intersections of the first conductive layers and the first columnar portions;

a second region which includes:

a plurality of second conductive layers stacked in the first direction and insulated from each other, second columnar portions extending in the first direction through the plurality of second conductive layers, and memory cells at intersections of the second conductive layers and the second columnar portions;

a third region between the first and second regions in a second direction perpendicular to the first direction, the third region including:

a plurality of third conductive layers stacked in the first direction and insulated from each other, the third conductive layers being between the first conductive layers and the second conductive layers in the second direction;

a plurality of switches arranged along the second direction, the plurality of switches being below the first, second, and third regions in the first direction; and a plurality of first contacts electrically connecting the plurality of third conductive layers to the plurality of switches, wherein the plurality of third conductive layers are configured in a staircase shape to be closest, in the first direction, to the plurality of switches in a middle portion of the third region, and farthest from, in the first direction, the plurality of switches at an end portion closer to the first or second region, the pluralities of first, second, and third conductive layers are each divided along the first direction into at least a first stack group, and the third conductive layer closest to the plurality of switches among the plurality of third conductive layers of the first stack group is in an electrically floating state.

* * * * *